United States Patent
Peng

(10) Patent No.: US 6,490,545 B1
(45) Date of Patent: Dec. 3, 2002

(54) METHOD AND APPARATUS FOR ADAPTIVE CO-VERIFICATION OF SOFTWARE AND HARDWARE DESIGNS

(75) Inventor: Jason Peng, Sunnyvale, CA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 0 days.

(21) Appl. No.: 09/519,659

(22) Filed: Mar. 6, 2000

(51) Int. Cl.[7] .................. G06F 9/455; G06F 17/50; G06F 19/00
(52) U.S. Cl. ................. 703/13; 709/102; 716/5; 717/135; 717/140
(58) Field of Search .................. 703/2.13, 14, 22, 703/23; 709/102, 104; 712/28; 716/1, 5; 717/136, 140, 124, 135

(56) References Cited

U.S. PATENT DOCUMENTS 6,086,628 A * 7/2000 Dave et al. ............ 716/7
6,097,886 A * 8/2000 Dave et al. ............ 703/23

OTHER PUBLICATIONS

Eles et al., P. VHDL System–Level Specification and Partitioning in a Hardware/Software Co–Synthesis Environment, Proceedings of the Third International Symposium on Hardware/Software Codesign, 1994, pp. 49–55.*

Allara et al., A. A Flexible Model for Evaluating teh Behavior of Hardware/Software Systems, Proceedings of the International Workshop on Harware/Software Codesign, 1997, Codes/Cashe '97, pp. 109–114.*

Egolf et al., T.W. Fixed–Point Co–Design in DSP, VLSI Signal Processing, VII, 1994, pp. 113–126.*

Panda, P.R. SystemC—A Modeling Platform Supporting Multiple Design Abstractions, The 14th International Symposium on System Synthesis, 2001, pp. 75–80.*

Rangarajan et al., M. Gravity: An Object–Oriented Framework for Hardware/Software Tool Integration, Simulation Symposium, 1997, 30th Annual, pp. 24–30.*

Eker et al., J. A Matlab Toolbox for Real–Time and Control Systems Co–Design, Sixth International Conference on Real–Time Computing Systems and Applications, 1999, RTCSA '99, pp. 320–327.*

Kennedy et al., A. An Integrated Environment for Simulation and Modelling, IEE Seminar on Tools for Simulation and Modelling, (Ref. No. 2000.043), 2000, pp. 2/1–2/4.*

* cited by examiner

Primary Examiner—Russell Frejd
(74) Attorney, Agent, or Firm—Mikio Ishimaru

(57) ABSTRACT

A simulation system is provided for simulating behavior of a device for implementing an algorithm using a software model and a hardware model which are converted to a common programming language and mathematical notation. The simulation system uses the same input user interface for the software model and the hardware model. Further, the simulation system uses the same output user interface for generating the simulation results for both the software model and the hardware model in the common programming language and mathematical notation, thereby allowing a user to easily verify and analyze the software and hardware simulation results for optimization of the device.

24 Claims, 1 Drawing Sheet

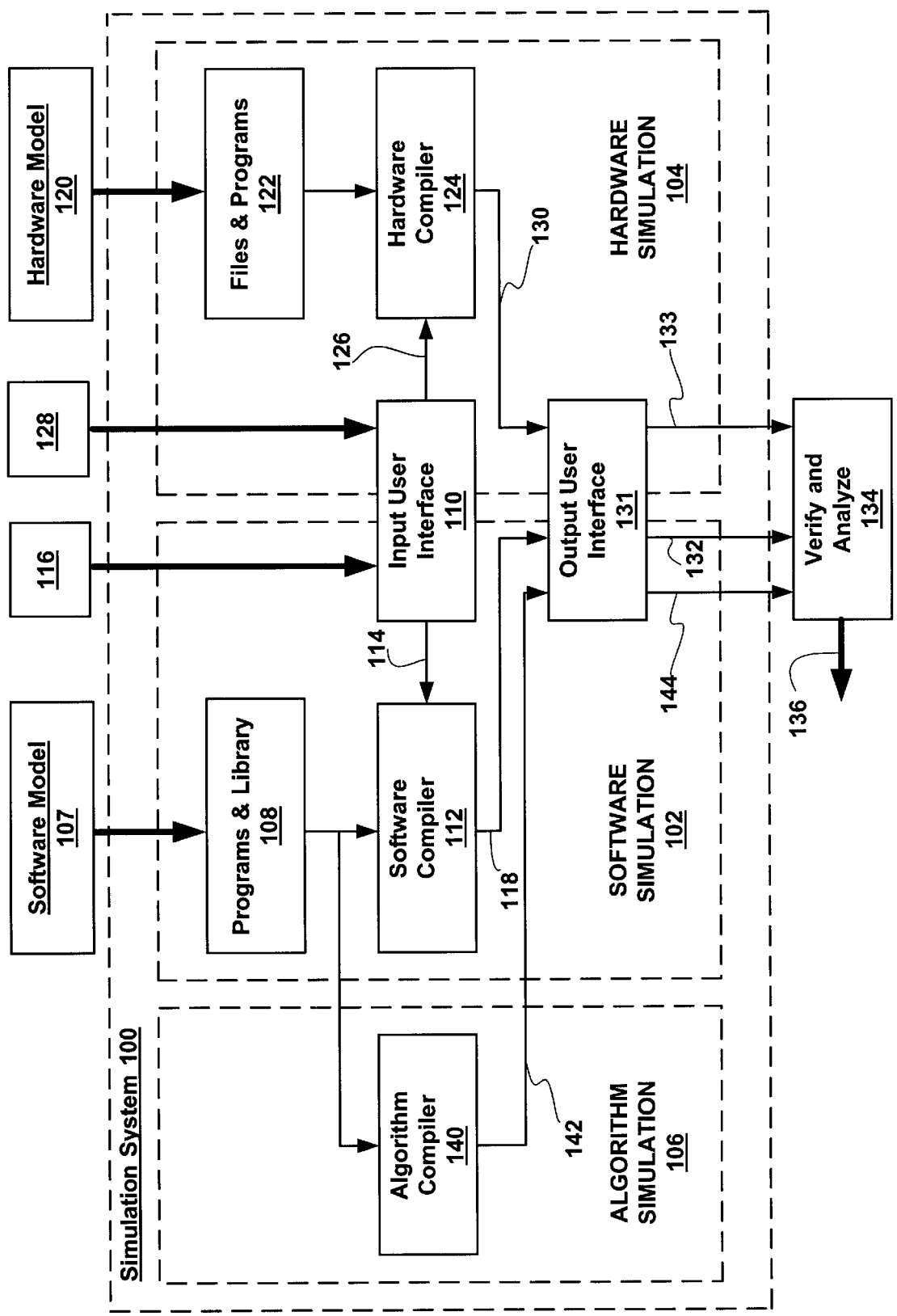

METHOD AND APPARATUS FOR ADAPTIVE CO-VERIFICATION OF SOFTWARE AND HARDWARE DESIGNS

TECHNICAL FIELD

The present invention relates generally to software and hardware designs and more particularly to the verification of software and hardware designs.

BACKGROUND ART

Electronic Design Automation (EDA) is a computer-based tool configured to provide designers with automated tools for designing and verifying user's custom circuit designs, such as integrated circuit or printed circuit board designs. EDA is used for creating, analyzing, and editing any electronic design for the purpose of simulation, prototyping, execution, or computing. EDA technology can also be used to develop systems that will use the user-designed subsystem or component. The end result of EDA is a modified and enhanced design that is an improvement over the original design.

The use of software simulation and hardware simulation for a design is commonly known as cooperative design, or co-design, and is recognized in various industries that use and benefit from EDA technology. To optimize a co-design, it is desirable to perform software and hardware simulation and verification at the same time. This would allow a designer to consider the tradeoffs between the software and hardware simulations simultaneously. However, current software and hardware co-design simulations and verifications are cumbersome for the user because of the separate and independent nature of two processes. One problem is that most software designs and its simulation results use the floating-point environment (data format) while most hardware designs and its simulation results use the fixed-point environment. Since the simulation results of the software designs and the corresponding hardware designs are in different environments, it is difficult to verify or compare the software and hardware simulation results.

Another problem is that most software and hardware co-design tools in the market are inflexible. Specifically, it is difficult to integrate the tools of one supplier into the products of another. To avoid the problem of integrating tools from various suppliers, users often purchase both software and hardware co-design tools from one supplier. As a result, the users' choice for upgrading either the software tool or the hardware tool is limited.

Accordingly, there is a need for a method and an apparatus that allow for the co-verification of software and hardware designs and the integration of software and hardware co-design tools manufactured by different suppliers.

DISCLOSURE OF THE INVENTION

The present invention provides a simulation system for simulating behavior of a device for implementing an algorithm using a software model and a hardware model which are converted to a common programming language and mathematical notation. The simulation system uses the same input user interface for the software model and the hardware model. Further, the simulation system uses the same output user interface for generating the simulation results for both the software model and the hardware model in the common programming language and mathematical notation, thereby allowing a user to easily verify and analyze the software and hardware simulation results.

The present invention further provides a simulation system which allows the integration of design tools from multiple suppliers. This would permit a user to mix and match the design tools to provide an optimized simulation system for an optimized device design.

The present invention further provides a simulation system which generates both software simulation results and hardware simulation results in a fixed-point data format to allow for easy verification and analysis of the software and hardware simulation results.

The present invention further provides a simulation system which uses ANSI-C programs and a fixed-point C library in the software model and Verilog Files and PLI-C programs in the hardware model to generate software simulation results and hardware simulation results in a fixed-point data format. The use of a common data format allows the generation of the software simulation results and the hardware simulation results using a common output user interface. This also allows a user to easily verify and analyze the software and hardware simulation results.

The present invention still further provides a simulation system which includes an output user interface that can be configured to generate algorithm simulation results for the software model in a fixed-point data format. This would allow the algorithm simulation to use the same output user interface as the software model. By using a common output user interface a user can easily analyze the software simulation results, the hardware simulation results, and the algorithm simulation results.

The above and additional advantages of the present invention will become apparent to those skilled in the art from a reading of the following detailed description when taken in conjunction with the accompanying drawings.

BRIEF DESCRIPTION OF THE DRAWINGS

The FIGURE is a schematic diagram for a simulation system according to the present invention.

BEST MODE FOR CARRYING OUT THE INVENTION

Referring now to the FIGURE, therein is shown a schematic diagram of a software and hardware simulation system 100, which allows for the adaptive co-verification of software and hardware simulation results for a device implementing a target algorithm and which is constructed in accordance with present invention. The simulation system 100 may be a dedicated electronic system or may be run on a general purpose computer. It has a software simulation subsystem 102, a hardware simulation subsystem 104, and an algorithm simulation subsystem 106.

The software simulation subsystem 102 is provided with a software model 107 of the target algorithm designed using any number of commercially available design tools. The software model 107 could be written in a number of different languages and either a fixed-point or floating-point mathematical notation, although software is generally written using floating-point mathematical notation. One example is ANSI-C, which is a programming language commonly used for software designs. The software model 107 is provided to a programs/library 108, which contains programs and a library for converting the floating-point programming to fixed-point programming. For a software programming language such as ANSI-C, ANSI-C programs and a fixed-point C library, such as those available from Frontier Design, Inc., PMB 221 9000 Crow Canyon Drive, Suite S, Danville, Calif. 94506, would be used.

The output of the programs/library 108 along with an output from a input user interface 110 are provided to a software compiler 112 which converts the high-level language from the programs/library 108 a low-level language for execution.

The input user interface 110 generates software input data 114 in response to a software user input 116. The software input data 114 is provided to the software compiler 112 which provides executable software programs 118, such as C-executables.

The hardware simulation subsystem 104 is provided with a hardware model 120 of the device (not shown), which is to be simulated and which will implement the target algorithm. The hardware model 120 is designed using any number of commercially available design tools and could be written in a number of different languages. One example is Verilog, which is a fixed-point programming language commonly used to describe hardware designs. The hardware model is provided to files and programs 122, which contains files and programs for converting hardware model language into software model language. For example, for Verilog, the files would be Verilog files and for ANSI-C, the programs would be one of the commonly available PLI-C programs. The PLI-C stands for Program Language Interface for (ANSI-)C and is available from companies such as Cadence Design Systems, Inc., 555 River Oaks Parkway, San Jose, Calif. 95134.

The output of the files and programs 122 is provided to a hardware compiler 124, which could be a number of different types. For Verilog files and ANSI-C, the Chronologic Verilog Compiler Simulator (VCS) hardware compiler could be used which is available from Sysnopsis, Inc., 700 East Middlefield Rd., Mountain View, Calif. 94043.

The input user interface 110 also generates hardware input data at a hardware output 126 in response to a hardware user input 128. The hardware output 126 is provided to the hardware compiler 124 which provides executable hardware programs 130, such as VCS and PLI executables.

The executable software programs 118 and the executable hardware programs 130 are provided to an output user interface 131. The output user interface 131 provides software simulation results 132 for the software model 107 and hardware simulation results 133 for the hardware model 120. Since the software simulation results 132 and the hardware simulation results 133 are both in fixed-point data format, they can be generated by the same output user interface 131 for use by a verify and analyze system 134, which outputs results at results arrow 136.

The algorithm simulation subsystem 106 includes an algorithm compiler 140, which receives the output of the programs/library 108 into which the algorithm has been inputted from the software model 107. The algorithm compiler 140 compiles it in a mathematical environment to produce a simulation executable program for the output user interface 131.

Most software and hardware designs are used for algorithm implementation. Thus, it is a goal that the algorithm be mathematically accurate. The algorithm simulation subsystem 106 is used to verify the algorithm and compare it with the results of the software and hardware design to provide the algorithm simulation results 144, which are also in fixed-point data format. The algorithm simulation results 144 are used by the verify and analyze system 134 to output the results arrow 136.

An example of the algorithm compiler 140 is the Matlab compiler from Mathworks, Inc. 3 Apple Hill Drive, Natick, Mass. 01760-2098. The Matlab compiler generates Matlab executables in response to the fixed-point C software model. The output user interface 131 is configured to generate the algorithm simulation results 144 in a fixed-point data format in response to the Matlab executables. The algorithm simulation results 144 are then used to improve the reliability of the software and hardware simulation results 132 and 133.

In operation, the software model 107 is provided to the programs/library 108. The software model 107 is converted in to a fixed-point, common language, programming. For an ANSI-C model, the software model 107 is converted into fixed-point C programming. A user then provides the software user input 116 to the input user interface 110. In response, the input user interface 110 provides the software input data 114 to the software compiler 112. The software compiler 112 uses the fixed-point programming and the software input data to generate software executables. For the ANSI-C model, the software compiler 112 generates C-executables for the output user interface 131. The output user interface 131 then generates software simulation results 132 in a fixed-point data format. For the ANSI-C model, the fixed-point data format will be in ANSI-C.

A hardware model 120 of the device is provided to the files and programs 122 for conversion to a common language programming. For a Verilog model, the hardware model 120 is converted using PLI-C to C. No fixed-point conversion would be required since the programs would already be in fixed-point. The user then provides the hardware user input 128 to the input user interface 110. In response, the input user interface 110 provides hardware input data 126 to the hardware compiler 124. The hardware compiler 124 uses the C programming and the hardware input data to generate the hardware executables. For ANSI-C, the VCS compiler generates hardware executables for the output user interface 131. The output user interface 131 then generates hardware simulation results 133 in the common language format. For a Verilog hardware model in a fixed-point data format, the common language would be ANSI-C.

Since both the software simulation results 132 and the hardware simulation results 133 are in fixed-point data format in the same language, they can be generated by the same output user interface 131. By using the same output user interface 131, the user can easily verify and analyze the software simulation results 132 and the hardware simulation results 133.

The software model is also provided to the algorithm compiler 140 which is operatively coupled to receive the software model in fixed-point C. For fixed-point C, the Matlab compiler could be used to generate Matlab-executables, such as C-MEX files. The output user interface 131 is configured to generate algorithm simulation results 144 for the algorithm inputted at the software model 107 in the fixed-point C data format. The algorithm simulation results 144 can be used to improve the reliability of the software and hardware simulation results 132 and 133. Therefore, by using the same output user interface 131, the user can easily verify and analyze the software simulation results 132, the hardware simulation results 133, and the algorithm simulation results 144.

Alternatively, the Simulink environment which handles algorithm as models may be used to verify target algorithms in Matlab. Simulink is an interactive environment for modeling, simulating, and prototyping dynamic systems, which is also available from Mathworks, supra. In this case, the input and output must be configured as Simulink-Function parameters. Moreover, a C initialization routine must be placed into the initialization section of the Simulink specific model function. For the same reason, the C execution routine must be placed into the execution section of the Simulink specific model function.

In summary, software and hardware can be designed using any number of commercially available design tools and the simulation system of the present invention can adapt to different design tools. In the best mode, the simulation system operates by converting the programming of software models in floating-point to fixed-point and converting programming of hardware models in hardware language to software language, which permits software and hardware users to share the same input user interface and to have the software and hardware simulation results generated by the same output user interface. This allows both software and hardware users to easily verify and analyze the software and hardware simulation results to optimize the final design of the software and hardware for the target algorithm being implemented.

Further, the output user interface can be configured to generate algorithm simulation results in fixed-point in the same language as the hardware and software. Therefore, by using the same output user interface, the user can easily analyze the software, the hardware, and the algorithm simulation results.

Further, by changing the languages used to describe the software or the hardware model, the present invention provides a method and an apparatus for integrating and adapting to design tools from multiple suppliers. This would allow a user to mix and match the design tools to provide an optimized simulation system.

While the best mode for the software simulation subsystem includes ANSI-C programs and fixed-point C library for the software model and a C compiler, it should be understood that other software and compilers that generate simulation results in fixed-point data format might be used. Similarly, while the best mode for the hardware simulation subsystem includes using Verilog files and PLI-C programs for the hardware model and a VCS compiler, it should be understood that other software and compilers that generate simulation results in fixed-point data format might be used. Further, hardware models which use floating-point programming could also be simulated, verified, and analyzed by the present invention.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A method of simulating a behavior of a device in a simulation system, comprising:

providing a software model for the device in a first programming language and a first mathematical notation;

providing software input data using an input user interface;

converting the software model in the first programming language and mathematical notation into a common programming language and mathematical notation;

compiling the software model in the common programming language and mathematical notation and using the software input data to generate software executables;

providing a hardware model for the device using a second programming language and mathematical notation;

providing hardware input data using the input user interface;

converting the hardware model in the second programming language and mathematical notation into the common programming language and mathematical notation;

compiling the hardware model in the common programming language and mathematical notation and using the hardware input data to generate hardware executables;

generating software and hardware simulation results from the software and hardware executables in the common programming language and mathematical notation; and analyzing the software simulation results and the hardware simulation results.

2. The method as claimed in claim 1 wherein:

the providing of the software model uses floating-point mathematical notation; and the converting of the first programming language and mathematical notation converts the software model to fixed-point mathematical notation.

3. The method as claimed in claim 1 wherein:

the providing of the hardware model uses fixed-point mathematical notation; and the converting of the second programming language and mathematical notation converts the hardware model to floating-point mathematical notation.

4. The method as claimed in claim 1 wherein:

the providing of the software model uses software programming language; and the converting of the first programming language and mathematical notation converts the software model to a hardware programming language.

5. The method as claimed in claim 1 wherein:

the providing of the hardware model uses hardware programming language; and the converting of the second programming language and mathematical notation converts the hardware model to a software programming language.

6. The method as claimed in claim 1 including:

providing the algorithm in the first programming language and mathematical notation;

compiling the algorithm in the common programming language and mathematical notation;

generating algorithm executables;

generating algorithm simulation results for the algorithm in the common programming language and mathematical notation; and analyzing the algorithm simulation results.

7. The method as claimed in claim 1 wherein:

the providing of the algorithm uses floating-point mathematical notation; and the converting of the first programming language and mathematical notation converts the algorithm to fixed-point mathematical notation.

8. A method of simulating an algorithm implementing device in a simulation system, comprising:

providing a software model for an algorithm in ANSI-C programming language and a first mathematical notation;

providing software and hardware input data using an input user interface;

converting the software model in ANSI-C programming language and mathematical notation into ANSI-C programming language and a different mathematical notation;

compiling the software model in ANSI-C programming language and the different mathematical notation and using the software input data to generate software executables;

generating software simulation results for the software model in ANSI-C programming language and the different mathematical notation using a first output user interface in response to the software executables;

providing a hardware model for the algorithm using Verilog programming language and the different mathematical notation;

converting the hardware model in Verilog programming language and mathematical notation into ANSI-C programming language and the different mathematical notation;

compiling the hardware model in ANSI-C programming language and the different mathematical notation and using the hardware input data to generate hardware executables;

generating software and hardware simulation results from the software and hardware executables in ANSI-C programming language and the different mathematical notation; and verifying and analyzing the software and the hardware simulation results.

9. The method as claimed in claim 8 wherein:
the providing of the software model uses floating-point mathematical notation; and
the converting to the different mathematical notation converts the software model to fixed-point mathematical notation.

10. The method as claimed in claim 8 wherein:
the providing of the hardware model uses fixed-point mathematical notation; and the converting to the different mathematical notation converts the hardware model to floating-point mathematical notation.

11. The method as claimed in claim 8 including:
providing the algorithm in ANSI-C programming language and a first mathematical notation;
compiling the algorithm in ANSI-C and a different mathematical notation;
generating algorithm executables;
generating an algorithm simulation result for the algorithm in ANSI-C programming language and the different mathematical notation; and
verifying and analyzing the algorithm simulation result.

12. The method as claimed in claim 8 wherein:
the providing of the algorithm uses floating-point mathematical notation; and
the converting of the mathematical notation converts the algorithm to fixed-point mathematical notation.

13. A simulation system, comprising:
a software model for an algorithm in a first programming language and a first mathematical notation;
an input user interface for providing software and hardware input data;
a first program for converting the software model in the first programming language and mathematical notation into a common programming language and mathematical notation;

a compiler for compiling the software model in the common programming language and mathematical notation and using the software input data to generate software executables;

a hardware model for the algorithm using a second programming language and mathematical notation;

a second program for converting the hardware model in the second programming language and mathematical notation into the common programming language and mathematical notation;

a compiler for compiling the hardware model in the common programming language and mathematical notation and using the hardware input data to generate hardware executables;

an output user interface for generating software and hardware simulation results from the software and hardware executables in the common programming language and mathematical notation; and an analyzing system for analyzing the software and the hardware simulation results and outputting the results.

14. The simulation system as claimed in claim 13 wherein:
the software model uses floating-point mathematical notation; and
the first program converts the software model to fixed-point mathematical notation.

15. The simulation system as claimed in claim 13 wherein:
the hardware model uses fixed-point mathematical notation; and
the second program converts the hardware model to floating-point mathematical notation.

16. The simulation system as claimed in claim 13 wherein:
the software model uses software programming language; and
the first program converts the software programming language to a hardware programming language.

17. The simulation system as claimed in claim 13 wherein:
the hardware model uses hardware programming language; and
the second program converts the hardware programming language to a software programming language.

18. The simulation system as claimed in claim 13 including:
an algorithm in the first programming language and mathematical notation;
a compiler for compiling the algorithm in the common programming language and mathematical notation to generate algorithm executables;
the output user interface generates an algorithm simulation result for the algorithm in the common programming language and mathematical notation; and
the analyzing system for analyzing the algorithm simulation result and outputting a result.

19. The simulation system as claimed in claim 13 wherein:
an algorithm uses floating-point mathematical notation; and
the first program converts the algorithm to fixed-point mathematical notation.

20. A simulation system for simulating an algorithm implementing device, comprising:

a software model for the algorithm in ANSI-C programming language and a first mathematical notation;

an input user interface for providing software and hardware input data;

a first program for converting the software model in ANSI-C programming language and mathematical notation into ANSI-C programming language and a different mathematical notation;

a compiler for compiling the software model in ANSI-C programming language and the different mathematical notation and using the software input data to generate software executables;

a hardware model for the algorithm implementing device using Verilog programming language and the different mathematical notation;

a second program for converting the hardware model in Verilog programming language and mathematical notation into ANSI-C programming language and the different mathematical notation;

a compiler for compiling the hardware model in ANSI-C programming language and the different mathematical notation and using the hardware input data to generate hardware executables;

an output user interface for generating software and hardware simulation results from the software and hardware executables in ANSI-C programming language and the different mathematical notation; and a verifying and analyzing system for verifying and analyzing the software and the hardware simulation results and outputting a result.

21. The simulation system as claimed in claim 20 wherein:

the software model uses floating-point mathematical notation; and the first program converts the software model to fixed-point mathematical notation.

22. The simulation system as claimed in claim 20 wherein:

the hardware model uses fixed-point mathematical notation; and the second program converts the hardware model to floating-point mathematical notation.

23. The simulation system as claimed in claim 20 including:

the first program for converting the algorithm into ANSI-C programming language and a first mathematical notation;

a compiler for compiling the algorithm in ANSI-C and the different mathematical notation to generate algorithm executables;

the output user interface for generating algorithm simulation results for the algorithm in ANSI-C programming language and the different mathematical notation; and the verifying and analyzing system for verifying and analyzing the algorithm simulation results.

24. The simulation system as claimed in claim 20 wherein:

the algorithm uses floating-point mathematical notation; and the first program converts the algorithm to fixed-point mathematical notation.

* * * * *